(12) United States Patent
Bichler et al.

(10) Patent No.: US 8,795,479 B2
(45) Date of Patent: Aug. 5, 2014

(54) WAFER CLAMP ASSEMBLY FOR HOLDING A WAFER DURING A DEPOSITION PROCESS

(75) Inventors: Hermann Bichler, Rohrbach (DE); Reinhard Hanzlik, Freising (DE); Stefan Fries, Landshut (DE); Frank Mueller, Freising (DE); Heinrich Wachinger, Helfenbrunn (DE)

(73) Assignee: Texas Instruments Deutschland GmbH, Freising (DE)

( * ) Notice: Subject to any disclaimer, the term of this patent is extended or adjusted under 35 U.S.C. 154(b) by 718 days.

(21) Appl. No.: 11/456,722

(22) Filed: Jul. 11, 2006

(65) Prior Publication Data

US 2007/0012561 A1 Jan. 18, 2007

(30) Foreign Application Priority Data

Jul. 12, 2005 (DE) .................. 10 2005 032 547

(51) Int. Cl.
*C23C 14/50* (2006.01)
*C23C 16/458* (2006.01)
*H01L 21/687* (2006.01)

(52) U.S. Cl.
CPC ............ *C23C 14/50* (2013.01); *C23C 16/4585* (2013.01); *H01L 21/68721* (2013.01); *H01L 21/68728* (2013.01)
USPC ................. 204/192.25; 118/728; 204/298.15; 204/192.12

(58) Field of Classification Search
CPC ................ C23C 14/50; C23C 16/4585; H01L 21/68721; H01L 21/68728
USPC ........... 156/345, 345.51; 204/298.01, 298.15, 204/297.01, 192.12, 192.25; 118/721, 504, 118/728; 269/254 R, 289 R
See application file for complete search history.

(56) References Cited

U.S. PATENT DOCUMENTS

| | | | | |
|---|---|---|---|---|
| 4,978,412 | A * | 12/1990 | Aoki et al. | 156/345.51 |
| 5,292,399 | A * | 3/1994 | Lee et al. | 438/716 |
| 5,316,278 | A * | 5/1994 | Sherstinsky et al. | 269/254 R |
| 5,860,640 | A * | 1/1999 | Marohl et al. | 269/289 R |
| 6,008,134 | A | 12/1999 | Ferguson et al. | |
| 6,171,453 | B1 * | 1/2001 | Chung et al. | 204/192.12 |
| 6,767,846 | B2 * | 7/2004 | Kopacz et al. | 438/758 |
| 2004/0082192 | A1 | 4/2004 | Kopacz et al. | |
| 2006/0207508 | A1 * | 9/2006 | Leung | 118/728 |

FOREIGN PATENT DOCUMENTS

EP 0742579 11/1996

* cited by examiner

*Primary Examiner* — Keith Hendricks
(74) *Attorney, Agent, or Firm* — Alan A. R. Cooper; W. James Brady, III; Frederick J. Telecky, Jr.

(57) ABSTRACT

A wafer clamp assembly for holding a wafer during a deposition process comprises an outer annular member defining a central recess that has a diameter slightly greater than the diameter of the wafer. A plurality of finger members are carried by the outer annular member and extend radially inwardly from the outer annular member into the central recess, wherein each of the finger members has a free end for contacting the wafer during the deposition process.

10 Claims, 3 Drawing Sheets

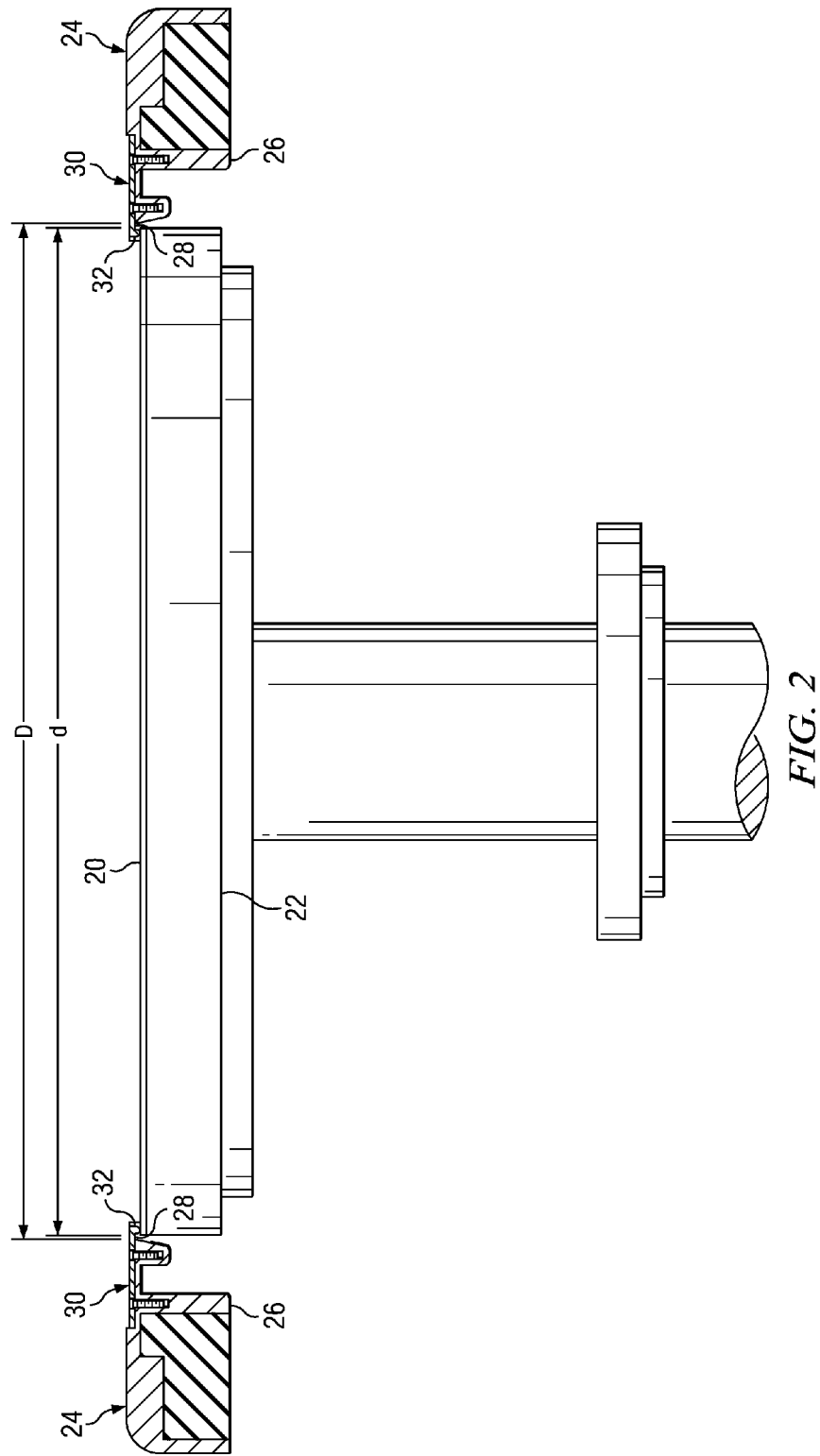

WAFER CLAMP ASSEMBLY FOR HOLDING A WAFER DURING A DEPOSITION PROCESS

The present invention relates to a wafer clamp assembly for holding a wafer during a deposition process.

BACKGROUND

During most deposition processes. it is necessary to hold the wafer firmly against a support surface. During a sputter deposition process, for example, the wafer is held to a pedestal of a heater unit which is located in a chamber filled with a noble gas or reactive gas up to a pressure in the millitorr range. Usually, a clamp ring is used for clamping the wafer to the support surface. The clamp ring has an inside diameter slightly smaller than the diameter of the wafer thus contacting the wafer all around its circumferential edge. Due to the large contact surface the edge exclusion, i.e., the wafer area where no sputter deposition takes place or sputter deposition is minimized, is in a considerable range thereby reducing the surface which can be used for good electrical dies. In addition, the wafer clamp is heated during the sputtering process due to ion bombardment from the plasma and a heat flux from the wafer clamp to the wafer takes place which makes the outer parts of the wafer overheated. The material deposited in this area loses its specified property and will decrease the number of good electrical dies per wafer. Another problem related to the clamp ring is that of clamp ring/wafer sticking. In the area of minimum distance to the wafer, the clamp ring may stick to the wafer due to the growing thickness of the sputtered material on the wafer clamp. One approach to minimize the possibility of sticking is to form a portion that overhangs the contact surface between the wafer and the clamp ring, thereby blocking sputtered material from being deposited in the area where the clamp makes contact with the wafer. However, the overhang portion does not completely eliminate the possibility of wafer sticking to the clamp ring.

SUMMARY

The present invention provides an improved wafer clamp assembly that provides minimum edge exclusion, a reduced risk of clamp assembly/wafer sticking and minimum heat flux from the wafer clamp assembly to the wafer.

According to the present invention the wafer clamp assembly comprises an outer annular member that defines a central recess that has a diameter slightly greater than the diameter of the wafer. A plurality of finger members are carried by the outer annular member and extend radially inwardly from the outer annular member into the central recess, wherein each of the finger members has a free end for contacting the wafer during the deposition process. Thus, the wafer clamp assembly does not contact the wafer all around its outer circumferential edge, but only at a few, selected areas where the finger members overhang the wafer. This leads to a reduced edge exclusion compared to that with a conventional wafer clamp ring and to a minimized heat flux from the wafer clamp assembly to the wafer thereby increasing the wafer surface area in which good electrical dies can be produced.

According to a preferred embodiment each of the finger members has a contact portion that is provided at a bottom surface of the respective finger member facing the wafer during the deposition process. Thus, the wafer is not contacted in the whole area in which the finger members overhang the wafer, but only in the area associated with the contact portions which leads to a further reduction in wafer/clamp assembly contact surface. In a further preferred embodiment the contact portion has a hemispherical shape so that a point contact is established between the wafer and the clamp assembly thereby reducing the contact area to a minimum.

BRIEF DESCRIPTION OF THE DRAWINGS

Further features and advantages of the invention read from the following description of an embodiment in accordance with the present invention and with reference to the drawings in which:

FIG. 2 schematically shows the preferred embodiment of a wafer clamp assembly according to the present invention, with a wafer being clamped to a heatable pedestal;

DETAILED DESCRIPTION OF EMBODIMENTS

Figure 1:
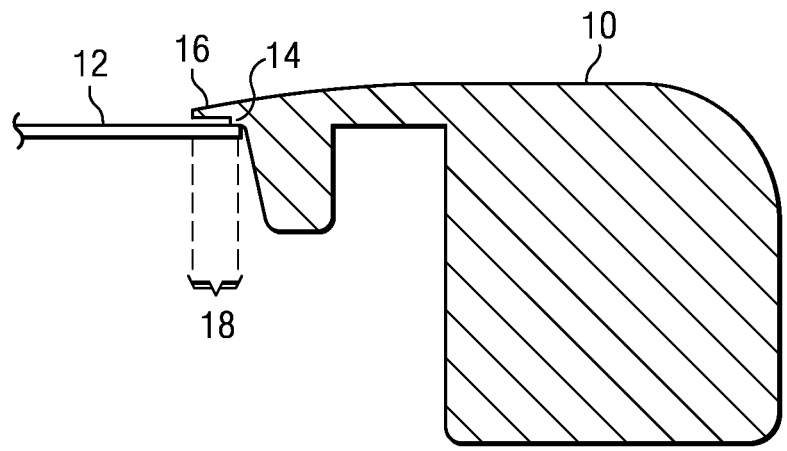
FIG. 1 schematically shows in a sectional view a conventional wafer clamp ring contacting a wafer all around its circumferential edge.

FIG. 1 of the drawings shows a part of a conventional wafer clamp ring 10 in a side view that has an inner diameter that is slightly smaller than the diameter of a wafer 12 to be clamped. The wafer clamp ring 10 has an annular contact portion 14 contacting the wafer 12 all around its outer circumferential edge. The wafer clamp ring 10 further has a portion 16 that overhangs the annular contact portion 14. In a region 18 in which the wafer clamp ring 10 contacts the wafer surface and in which the overhang portion 16 overhangs the wafer 12 no or only minimized sputter deposition takes place. The area of the covered region 18 defines the edge exclusion in which the wafer 12 cannot be used to produce good electrical dies. Further, due to the large contact surface between the wafer clamp ring 10 and the wafer 12 a heat flux from the heated wafer clamp ring 10 to the wafer 12 takes place which makes the wafer 12 near the clamp ring 10 overheated thereby also decreasing the number of good electrical dies per wafer 12.

FIGS. 2 to 5 show the preferred embodiment of a wafer clamp assembly according to the present invention. A wafer 20 is clamped to a heatable and vertically adjustable pedestal 22 by means of the wafer clamp assembly 24. The wafer clamp assembly 24 comprises an outer annular member 26. In the center of the outer annular member a central recess 28 is provided which has a diameter D that is slightly greater than the diameter d of the wafer 20 to be clamped so that the wafer 20 is not contacted by the outer annular member 26 during the deposition process. The preferred wafer clamp assembly 24 further comprises a number of finger members 30 that are carried by the outer annular member 26 and that extend radially inwardly from the outer annular member 26 into the central recess 28. The finger members 30 thus protrude from the outer annular member 26 into the central recess 28 thereby partly overhanging the wafer 20 with a free end 29. Each finger member 30 has a contact portion 32 that contacts the wafer 20 during the deposition process. The contact portion 32 is provided at a bottom surface 34 facing the wafer 20 during the deposition process and at a radially inwardly directed end 36 of the respective finger portion 30. The contact portion 32 has a hemispherical shape thereby establishing a point contact surface with the wafer 20.

Figure 3:
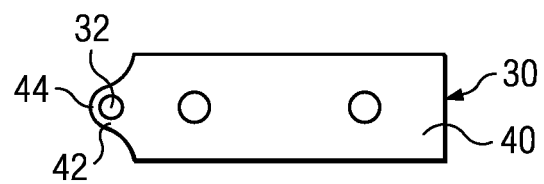
FIG. 3 schematically shows a part of the wafer clamp assembly of FIG. 2 in an enlarged view.

FIG. 3 of the drawings also shows a finger member 30 from a top view. The finger member 30 comprises a flat planar member having a first portion 40 with an essentially rectangular horizontal cross-section and a second portion 42 that forms the radially inwardly directed end 36 of the finger portion 30 at which the contact portion 32 is provided. The second portion 42 has a width that is gradually decreasing from a first width value, which corresponds to the width value of the rectangular first portion, to a second width value, which is preferably zero, in the radially inwardly direction so that a rounded tip 44 is formed.

Figure 4:
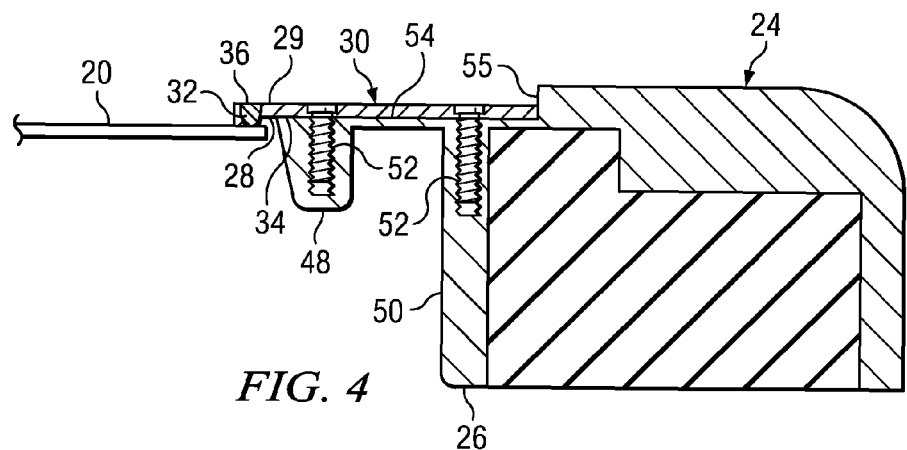
FIG. 4 schematically shows another part of the wafer clamp assembly of FIG. 2 in an enlarged view.

The outer annular member 26 has an annular first projection 48 and an annular second projection 50 that is located radially outward from the first projection 48. The first and second annular projections 48, 50 are directed downwardly during the deposition process. In the preferred embodiment, the numerous finger members 30 are connected to the outer annular member 26 by screw-mounting as shown in FIG. 4. Preferably, each finger member 30 is screw-mounted to the outer annular member 26 by means of two screws 52, wherein one of the screws 52 extends through the annular first projection 48 and the other of the screws 52 extends through the annular second projection 50 in a mounted state.

Figure 5:
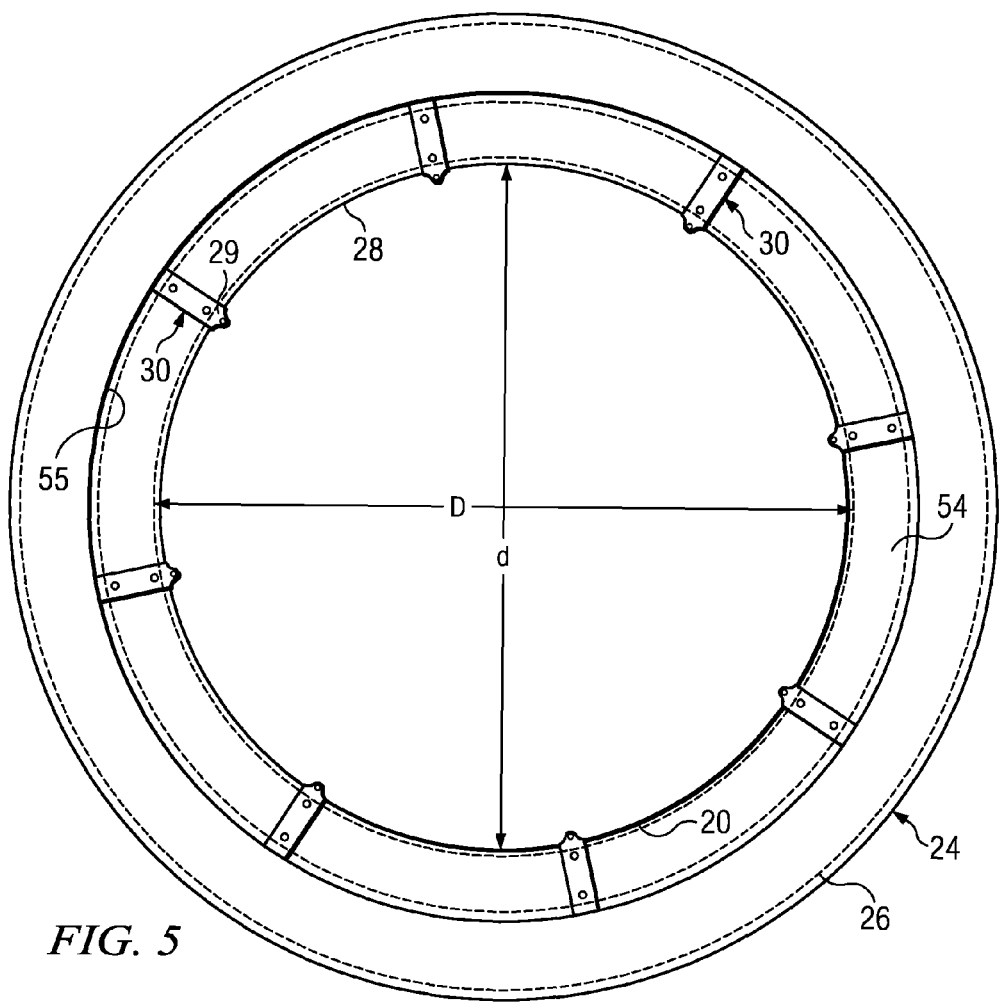
FIG. 5 schematically shows the preferred embodiment of a wafer clamp assembly of FIG. 2 in a top view.

Each finger member 30 is mounted in an annular depression 54 defined by a step 55 and formed in the top surface of the outer annular member 26. The step 55 forms a stop for the finger members 30. The annular depression 54 is a planar depression that has a rectangular horizontal cross-section that extends radially inwardly from the step 55 all the way over the inner circumferential edge of the outer annular member 26. In the mounted state in which the finger members 30 are placed into the annular depression 54 in and mounted to the outer annular member 26, their rounded tips 44 (see FIG. 3) project inwardly from the outer annular member 26 and thus shadow the outer edge of the wafer 20. A top view of the wafer clamp assembly is shown in FIG. 5.

The wafer clamp assembly 24 of the present invention overcomes the problems that are involved with the use of a conventional clamp ring 10 as shown in FIG. 1.

Firstly, the wafer clamp assembly 24 according to the present invention does not cooperate with the wafer 20 so as to shadow it all around its outer circumferential edge, but it only shadows the wafer 20 at a few, selected areas where the free ends of the finger members 30 overhang the wafer 20. Thus, compared with the wafer clamp ring 10 of FIG. 1 with the wafer clamp assembly 24 of the present invention a minimized edge exclusion is achieved thereby increasing the wafer surface that can be used for the production of good electrical dies. This advantageous effect is increased due to the shape of the second portions 42 which form rounded tips 44 and thus further minimize the shadowed wafer surface.

Secondly, the surface contact of the wafer clamp assembly 24 with the wafer 20 is also drastically reduced during the deposition process. The wafer clamp assembly 24 of the present invention only contacts the wafer 20 at the few, selected contact surfaces where the contact portions 32 of the finger portions 30 contact the wafer surface, instead of the contact surface all around the circumferential edge of the wafer with the wafer clamp ring 10 of FIG. 1. Due to the hemispherical shape of the contact portions 32 the contact surfaces are point contacts, thereby further reducing the surface contact of the clamp assembly 24 with the wafer 10. Due to this minimized surface contact the heat flow from the heated wafer clamp assembly 24 to the wafer 20 is insignificant, so that the parts of the wafer 20 near the wafer clamp assembly 24 do not become overheated. Further, since the surface contact is limited to just a few point contacts, there are only very few positions where the wafer 20 and the wafer clamp assembly 24 are in close proximity, so that the risk of wafer clamp assembly/wafer sticking is clearly reduced compared to that of the clamp ring assemblies known from the prior art.

The wafer clamp ring assembly 24 of the present invention can be manufactured in a very simple manner from a standard wafer clamp ring as shown, for example, in FIG. 1 of the drawings. The inner circumferential edge of such a standard wafer clamp ring is milled out so as to remove the annular contact portion 14 and the portion 16 overhanging the annular contact portion 14 and so as to form the depression 54 at the inner circumferential edge of the clamp ring. After that, the finger members 30 that have had to be manufactured particularly for the improved wafer clamp assembly 24 according to the present invention are mounted to the milled-out wafer clamp by placing them into the depression 54 with predetermined distances and connecting them to the milled-out wafer clamp. The milled-out wafer clamp forms the outer annular member 26 of the wafer clamp assembly 24. In the preferred embodiment the finger members 30 are screw-mounted to the milled-out wafer clamp.

What is claimed is:

1. A wafer clamp for holding a wafer during a semiconductor fabrication process, said wafer clamp comprising:
    a wafer clamp assembly having a step that defines a depression with a substantially flat, exposed surface, wherein the wafer clamp assembly is annular and the step is also annular;
    a plurality of substantially flat finger members mounted in the depression on the substantially flat, exposed surface, each substantially flat finger member having:
        a) a first portion with an essentially rectangular cross-section; and
        b) a second portion, the second portion having a free end that includes a contact portion, the second portion having a rounded tip;
    an outer annular member coupled to:
        a) each of the plurality of finger members and
        b) the wafer clamp assembly,
        the outer annular member having:
            a) a first annular projection, and
            b) a second annular projection;
    and a central recess defined by the first annular projection, wherein the central recess has a diameter that is greater than d, the diameter of the wafer, wherein the wafer can be clamped so that the wafer is not contacted by the outer annular member during a deposition process,
    wherein the contact portion of each finger member overhangs the wafer to be clamped only at selected areas, and
    wherein the finger members contact the wafer only at the selected areas where the finger members overhang the wafer, thereby reducing an edge exclusion of the wafer,
    wherein the contact portion has a hemispherical shape thereby establishing a point contact surface with the wafer, wherein the contact portion is immobile relative to the finger; and
    a first screw within the first annular projection and a second screw in the second annular projection.

2. The wafer clamp of claim 1 wherein the wafer clamp assembly is a heated wafer clamp assembly.

3. The wafer clamp of claim 1, wherein said outer annular member has radially-spaced first and second annular projections directed downwardly therefrom.

4. The wafer clamp of claim 1, wherein said outer annular member has radially-spaced first and second annular projections directed downwardly therefrom; and said finger members are screw-mounted at said first and second annular projections.

5. A method of holding a wafer during a semiconductor process, said method comprising:
- providing a plurality of substantially flat planar finger member mounted in an annular step defining a depression of a wafer clamp assembly;
- providing an outer annular member, coupled to the plurality of finger members and the wafer clamp assembly, the outer annular member having
  a) a first annular projection, and
  b) a second annular projection;
- contacting said wafer during the semiconductor fabrication process with the plurality of substantially flat finger members, wherein each of the finger members include:
  a) a first portion with an essentially rectangular cross-section; and
  b) a second portion, the second portion having a free end that includes a contact portion, the second portion having a rounded tip;
- a central recess defined by the first annular projection,
- wherein the central recess has a diameter that is greater than d, the diameter of the wafer, and
- wherein the wafer can be clamped so that the wafer is not contacted by the outer annular member during a deposition process of the semiconductor,
- wherein the contact portion overhangs the wafer to be clamped;
- wherein the contact portion of each finger member overhangs the wafer to be clamped only at selected areas,
- wherein the finger members contact the wafer only at the selected areas where the finger members overhang the wafer, thereby reducing an edge exclusion of the wafer, and
- wherein the contact portion has a hemispherical shape thereby establishing a point contact surface with the wafer,
- wherein said outer annular member has radially-spaced first and second annular projections directed downwardly therefrom; and said finger members are screw-mounted at said first and second annular projections.

6. The method of claim 5, wherein said contact portion is downwardly directed.

7. The method of claim 6, wherein said second portion has a horizontal cross-section that decreases radially inwardly from a first width value which matches a width value of a corresponding essentially rectangular horizontal cross-section of said first portion, down to a second width value which is zero.

8. A wafer clamp for holding a wafer during a semiconductor fabrication process, said wafer clamp comprising:
- a wafer clamp assembly having an annular step thereby defining an annular depression,
- a plurality of substantially flat finger members mounted in the step, each finger member having
  a) a first portion with an essentially rectangular cross-section; and
  b) a second portion, the second portion having a free end that includes a contact portion, the second portion having a rounded tip;
- an outer annular member coupled to the finger members and the wafer clamp assembly, the outer annular member having
  a) a first annular projection, and
  b) a second annular projection;
- a central recess defined by the contact portion of the plurality of finger members,
- wherein the central recess has a diameter that is greater than d, the diameter of the wafer, wherein the wafer can be clamped so that the wafer is not contacted by the outer annular member during a deposition process; and
- wherein said outer annular member has said first and second annular projections radially-spaced and directed downwardly therefrom;
- wherein said finger members are screw-mounted at said first and second annular projections;
- wherein the contact portion of finger member overhangs the wafer to be clamped only at selected areas, and
- wherein the finger members contact the wafer only at the selected areas where the finger members overhang the wafer, thereby reducing an edge exclusion of the wafer,
- wherein the contact portion has a hemispherical shape thereby establishing a point contact surface with the wafer.

9. The wafer clamp of claim 8, wherein said contact portion is downwardly directed.

10. The wafer clamp of claim 8, wherein said second portion has a horizontal cross-section that decreases radially inwardly from a first width value which matches a width value of a corresponding essentially rectangular horizontal cross-section of said first portion, down to a second width value which is zero.

* * * * *